US012327606B2

(12) United States Patent
Ikeda

(10) Patent No.: US 12,327,606 B2
(45) Date of Patent: Jun. 10, 2025

(54) SEMICONDUCTOR DEVICE

(71) Applicant: RENESAS ELECTRONICS CORPORATION, Tokyo (JP)

(72) Inventor: Motoshige Ikeda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 221 days.

(21) Appl. No.: 18/317,367

(22) Filed: May 15, 2023

(65) Prior Publication Data

US 2024/0013818 A1 Jan. 11, 2024

(30) Foreign Application Priority Data

Jul. 7, 2022 (JP) ................... 2022-109782

(51) Int. Cl.
*G11C 7/00* (2006.01)
*G11C 7/10* (2006.01)
*G11C 7/22* (2006.01)

(52) U.S. Cl.
CPC .......... *G11C 7/1084* (2013.01); *G11C 7/1069* (2013.01); *G11C 7/1096* (2013.01); *G11C 7/222* (2013.01)

(58) Field of Classification Search
CPC ....................................... G11C 7/22

USPC ..................................... 365/189.14
See application file for complete search history.

(56) References Cited

U.S. PATENT DOCUMENTS 8,510,503 B2 8/2013 Yagihashi
2021/0042247 A1* 2/2021 Kim ................. G06F 1/329

FOREIGN PATENT DOCUMENTS

JP 2010-160653 A 7/2010

* cited by examiner

*Primary Examiner* — Hoai V Ho
(74) *Attorney, Agent, or Firm* — Rimon P.C.

(57) ABSTRACT

A semiconductor device according to an embodiment includes a level detection unit that validates a level detection signal LD when a value indicated by stream data exceeds a threshold condition value, a ring buffer that cyclically stores internal data generated from the stream data in a storage area that is set within a predetermined address range, a data processing unit that operates with a bus clock and performs data processing using the internal data acquired from the ring buffer, and an address adjustment unit that adjusts a read address indicating a read start position of the ring buffer to a position that becomes a predetermined difference from a write address of the ring buffer at that time in accordance with a start of generation of the bus clock, and generates a bus clock during a period in which the level detection signal LD is valid.

10 Claims, 11 Drawing Sheets

First Example

Second Example

SEMICONDUCTOR DEVICE

CROSS-REFERENCE TO RELATED APPLICATIONS

The disclosure of Japanese Patent Application No. 2022-109782 filed on Jul. 7, 2022, including the specification, drawings and abstract is incorporated herein by reference in its entirety.

BACKGROUND

The present invention relates to a semiconductor device, and more particularly, to a semiconductor device having a ring buffer for updating data stored in a predetermined address range in a cyclic manner.

In a semiconductor device that performs information processing on stream data continuously transmitted in time, a frequency of a bus clock or a system clock that operates a system including a core clock used for capturing stream data and an information processing unit that performs specific processing in the semiconductor device is often different. Therefore, such a semiconductor device has a speed difference absorption function such as a ring buffer in order to absorb a speed difference between a stream data acquisition unit and an information processing unit. Therefore, an example of a ring buffer is disclosed in Patent Document 1.

[Patent Document 1] Japanese Unexamined Patent Application Publication No. 2010-160653

The ring buffer circuit described in Patent Document 1 includes a lead/write memory having an address designated by N bits, a write address counter pointer and a read address counter pointer of a read/write memory for counting N+1 bits of gray codes, and a write and read address conversion circuit for converting the N+1 bits of gray codes output by the write and read address counter pointer into an address of N bits that can be directly designated as a read/write address of the read/write memory.

SUMMARY

However, when power consumption is reduced by stopping a bus clock for operating an information-processing processing unit such as a bus clock in a situation where invalid data in which silence is recorded as stream data is input, for example, there arises a problem that data disappears in a time required for starting supply of the bus clock and returning the operation of the information processing unit. That is, the ring buffer circuit description in Patent Document 1 has a problem that it is difficult to reduce the power consumption of the semiconductor device.

Other objects and novel features will become apparent from the description of this specification and the accompanying drawings.

A semiconductor device according to an embodiment includes a level detection unit that validates a level detection signal when a value indicated by stream data exceeds a threshold condition value, a ring buffer that cyclically stores internal data generated from the stream data in a storage area that is set within a predetermined address range, a data processing unit that operates with a bus clock and performs data processing using the internal data acquired from the buffer, and an address adjustment unit that adjusts a read address indicating a read start position of the ring buffer to a position that becomes a predetermined difference from a write address of the ring buffer at that time in accordance with a start of generation of the bus clock, and generates a bus clock during a period in which the level detection signal is in a valid state.

In the semiconductor device according to one embodiment, power consumption can be reduced.

DETAILED DESCRIPTION

Figure 1:
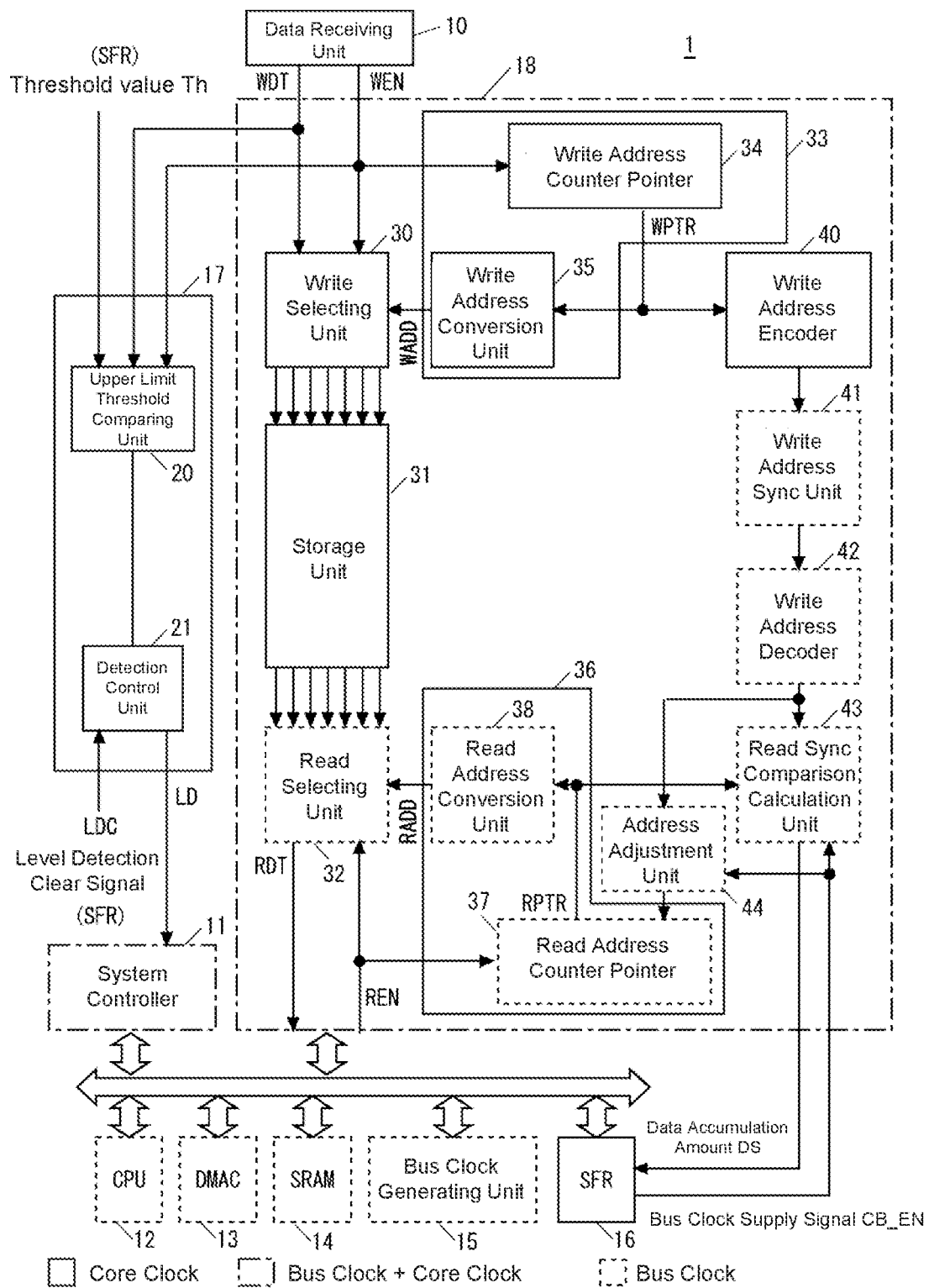
FIG. 1 is a block diagram of a semiconductor device according to a first embodiment.

For clarity of explanation, the following description and drawings are appropriately omitted and simplified. In the drawings, the same elements are denoted by the same reference numerals, and redundant descriptions are omitted as necessary.

Embodiment 1

First, FIG. 1 is a block diagram of a semiconductor device 1 according to a first embodiment. As illustrated in FIG. 1, the device 1 according to the first embodiment includes a data receiving unit 10, a system controller 11, and an arithmetic unit (a CPU (Central Processing Unit)) 12, DMAC (Direct Memory Access Controller) 13 of FIG. 1, a memory 14, a bus clock generating unit 15, a register 16, a level detecting unit 17, and a ring buffer 18. Although SRAM (Static Random Access Memory) is shown as a memory in FIG. 1, a storage device usable in a computer such as a DRAMV (Dynamic Random Access Memory or a flash memory can be used in addition to SPAM.

The data receiving unit 10 converts stream data supplied from the outside into internally processable internal data (write data WDT in FIG. 1). For example, if the stream data is an analog signal that is temporally consecutive, the data receiving unit 10 converts the analog signal into digital data that can be internally processed by analog-to-digital conversion, and generates a write data WDT. Further, for example, if the digital data of the stream data is serial data that is continuously transmitted, the data receiving unit 10 converts the serial data into parallel data and generates a write data WDT. Further, the data receiving unit 10 operates based on a core clock used for acquiring stream data when generating the write data WDT. The core clock may be generated in the semiconductor device 1 or may be generated outside the semiconductor device 1. In addition, the data receiving unit 10 outputs the write data WDT in synchronization with the write enable WEN indicating the output timing of the write data WDT.

The system controller 11 operates the bus clock generator 15 while the level-detection-signal LD indicates a valid state. In addition, the system controller 11 switches the operation state of the bus clock generation unit 15 according to the state of the level detection signal LD, and rewrites the values of a plurality of registers in the register 16 that controls the operation of the level detection unit 17 and the ring buffer 18. Further, it is assumed that the system controller 11 operates on the basis of the core clock in a portion related to the reception process of the level-detection-signal LD, and operates on the basis of the bus clock in another portion.

The calculation unit 12 performs information processing using the read-data RDT read from the ring buffer 18 using DMAC13. The information processing performed by the arithmetic unit 12 is a process that differs depending on the type of the read-data RDT but is defined based on the specifications of the semiconductor device 1. DMAC13 is a memory interface circuit and is controlled by the arithmetic unit 12. DMAC13 performs a specific process of data transmission and reception between the arithmetic unit 12 and the memory 14 and between the arithmetic unit 12 and the ring buffer 18. The memory 14 is a storage device used in information processing of the arithmetic unit 12. The bus clock generation unit 15 generates a bus clock used in the semiconductor device 1. Whether or not the bus clock generation unit 15 generates a bus clock is controlled by the system controller 11.

The register 16 includes a plurality of registers in which setting values defining the operation of the semiconductor device 1 are stored. In the example shown in FIG. 1, at least a threshold setting register, a level detection clear register, a data accumulation amount register, and a bus clock supply signal register are included.

The threshold-setting value Th, the level-detection-clear signal LDC, the data-accumulation-amount DS, and the bus-clock-supply signal CB_EN may be signals directly outputted by the system controller 11 without using a register.

The threshold setting register stores threshold setting value Th used in the level detecting unit 17 to determine the validity of the stream data. The threshold-setting value Th is a value written by the system controller 11 or another external device.

The level detection clear register generates a level detection clear signal LDC for clearing the level detection signal LD to 0 by a write access from the arithmetic unit 12. The value stored in the level detection clear register is determined by the system controller 11 based on the operation sequence and the value of the level detection signal LD, and is rewritten by the arithmetic unit 12 in response to the determination by the system controller 11.

The data accumulation amount register stores a data accumulation amount DS indicating the data amount accumulated in the ring buffer 18. The data-accumulation amount DS is rewritten by the ring buffer 18 and is referred to by the arithmetic unit 12. The calculation unit 12 changes the number of data readouts according to the data accumulation amount DS or changes the content of information processing.

The bus clock supply signal register stores a logical value of the bus clock supply signal CB_EN that notifies the operation state of the bus clock generation unit 15. The value stored in the bus clock supply signal register is updated by the system controller 11. The system controller 11 rewrites the value of the bus clock supply signal register to a state (for example, a high level) in which the bus clock supply is valid in response to the bus clock generation unit 15 starting the generation of the bus clock, and rewrites the value of the bus clock supply signal register to a state (for example, a low level) in which the bus clock supply is stopped in response to the bus clock generation unit 15 stopping the generation of the bus clock.

The level detection unit 17 activates the level detection signal LD when the value indicated by the internal data (for example, the write data WDT) exceeds the threshold-condition value. In the embodiment illustrated in FIG. 1, a threshold setting Th is given as a threshold condition. For example, when the stream data is an analog signal, the level detecting unit 17 effectives the level detecting signal LD when the level of the analog signal exceeds the value indicated by the threshold setting value Th.

In the example illustrated in FIG. 1, the level detection unit 17 includes an upper limit threshold comparison unit 20 and a detection control unit 21. The upper limit threshold comparing unit 20 determines whether or not the value indicated by the write-data WDT exceeds the threshold setting value Th, and outputs the determination result to the detecting control unit 21. In addition, the upper limit threshold comparing unit 20 performs a magnitude comparing process between the write data WDT and the threshold setting Th while the write enable WEN indicates the valid state. The detection control unit 21 effectives (for example, at a high level) the level detection signal LD in response to the upper limit threshold comparing unit 20 determining that the write data WDT is equal to or larger than the threshold setting value Th. Further, in the semiconductor device 1, when it is determined that the processing is stopped in the data processing performed in CPU 12, the level detection signal LD outputted by the detection control unit 21 is invalidated by the level detection clear signal LDC (for example, the processing to be a low level).

The ring buffer 18 cyclically and sequentially stores the internal data (for example, the write data WDT) in a storage area that is set within a predetermined addressable area. Further, the ring buffer 18 includes a storage unit 31, and operates a circuit block related to writing to the storage unit 31 and the storage unit 31 with a core clock, and operates other parts with a bus clock. Details of the ring buffer 18 will be described later.

In the semiconductor device 1 according to the first embodiment, the data receiving unit 10 receives stream data continuously in time from the outside, and transmits the received stream data to the arithmetic unit 12 serving as a data processing unit via the ring buffer 18. In the semiconductor device 1 according to the first embodiment, DMAC13 and the memory 14 are used when the arithmetic unit 12 processes the stream data.

Further, in the semiconductor device 1 according to the first embodiment, the data reception unit 10 and the level detection unit 17 are operated by the core clock used for the reception processing of the stream data, the arithmetic unit 12, DMAC13, the memory 14, and the level detection unit 17 are operated by the bus clock used in the internal processing of the semiconductor device, and the system controller 11 and the ring buffer 18 are operated by using both the core clock and the bus clock. In the semiconductor device 1 according to the first embodiment, a bus clock is generated by selecting a period in which the level detection unit 17 determines that the stream data is valid data. Thus, in the semiconductor device 1 according to the first embodiment, the time for the internal circuit to operate is reduced, and the power consumption is reduced.

Here, in the semiconductor device 1 according to the first embodiment, the ring buffer 18 is provided with a configuration for preventing data accumulated in the ring buffer 18 from being lost when the supply of the bus clock to the internal circuit is restored. Although the configuration of the ring buffer 18 will be described in detail below, the characteristics of the semiconductor device 1 are not limited thereto. Further, the core clock is a clock signal used for receiving stream data, and whether or not it is synchronized with the bus clock depends on the specifications of the semiconductor device 1. In the following description, a case where the core clock and the bus clock are asynchronous clock signals will be described, but the core clock and the bus clock may be synchronized.

As illustrated in FIG. 1, the ring buffer 18 includes a write selection unit 30, a storage unit 31, a read selection unit 32, a write address generation unit 33, a read address generation unit 36, a write address encoder 40, a write address synchronization unit 41, a write address decoder 42, a read synchronization comparison operation unit 43, and a counter adjustment unit 44. The storage unit 31 is a data storage area in the ring buffer 18. The write selection unit 30, the read selection unit 32, the write address generation unit 33, the read address generation unit 36, the write address encoder 40, the write address synchronization unit 41, the write address decoder 42, the read synchronization comparison operation unit 43, and the counter adjustment unit 44 are peripheral circuits for writing data into and reading data from the storage unit 31.

Here, in the ring buffer 18, the write selection unit 30, the storage unit 31, the write address generation unit 33, and the write address encoder 40 are set to operate using the core clock as an operation clock. Further, the read selection unit 32, the read address generation unit 36, the write address synchronization unit 41, the write address decoder 42, the read synchronization comparison operation unit 43, and the counter adjustment unit 44 are set so as to operate with the bus clock as an operation clock.

The write address generation unit 33 generates a write address WADD that is cyclically changed by operating with a core clock used for taking in stream data. More specifically, the write address generation unit 33 includes a write address counter pointer (for example, a write pointer generation unit) 34 and a write address conversion unit 35.

The write address counter pointer 34 generates a write pointer WPTR that is cyclically repeated within a certain range. The write address counter pointer 34 advances the write pointer WPTR by one every time the write enable WEN is enabled (e.g., at a high level). The write address counter pointer 34 sequentially advances the value of the write pointer WPTR so that the value is cyclically repeated between the minimum value and the maximum value. The write address converting unit 35 conversions the write pointer WPTR into a write address WADD which is a real address of the storage unit 31. The write selection unit 30 selects a storage area designated by the write-address WADD and writes the write-data WDT to the selected storage area. In addition, the state selection unit 30 performs a write process to the storage unit 31 of the write-data WDT every time the write enable WEN is enabled.

The read address generation unit 36 operates with a bus clock and generates a read address RADD that changes cyclically. More specifically, the read address generation unit 36 includes a read address counter pointer (for example, a read pointer generation unit) 37 and a read address conversion unit 38.

The read address counter pointer 37 generates a read pointer RPTR that is cyclically repeated in a certain area. The read address counter pointer 37 advances the read pointer RPTR by one every time the read enable signal REN outputted by DMAC13 is enabled (for example, at a high level). The read address counter pointer 37 sequentially advances the value of the read pointer RPTR so that the value is cyclically repeated between the smallest value and the largest value. The read address converting unit 38 converts the read pointer RPTR into a read address RADD which is a real address of the storage unit 31. The read selection unit 32 selects a storage area designated by the read-address RADD, and reads the read-data RDT from the selected storage area. In addition, the read selection unit 32 performs a read process of the read data RDT every time the read enable REN is enabled, and transmits the read data RDT to DMAC13.

The write address counter pointer 34 outputs the write pointer WPTR as binary data. The write address encoder 40 converts the write pointer WPTR outputted by the write address counter pointer 34 into a gray code. A Gray code is a code in which, for a value consisting of a plurality of bits, a difference in codes indicating consecutive values is limited to only one bit. For example, if the writing pointer WPTR is 0, 1, 2, or 3 in deciles and the binary data at that time varies as 00, 01, 10, or 11, the gray code is 00, 01, 11, or 10.

The write address synchronization unit 41 replaces the write pointer WPTR indicated by the gray code from the core clock to the bus clock. The write address decoder 42 converts the write pointer WPTR outputted by the write address synchronization unit 41 from a gray code to a binary code.

Here, when data is transferred in an asynchronous clock processing system, a meta table may occur in which data is not transmitted correctly when the timing of the clock change and the timing of the data change are aligned. Therefore, when the core clock and the bus clock are asynchronous, data-corruption of the write-pointer WPTR indicated by the gray code can be reduced. That is, when the core clock and the bus clock are synchronized clocks, the write address encoder 40, the write address synchronization unit 41, and the write address decoder 42 may be omitted.

The read synchronous comparison/calculation unit 43 calculates a difference between the write pointer WPTR and the read pointer RPTR as a data accumulation amount DS that is an amount of data accumulated in the storage unit 31. In the first embodiment, at a timing when the bus clock supply signal CB_EN is inputted to the read synchronous comparative calculation unit 43 and the bus clock supply signal CB_EN is enabled, the read synchronous comparison calculation unit 43 calculates a data accumulation amount DS based on a difference between the read pointer RPTR and the write pointer WPTR after adjustment of the read pointer RPTR by the counter adjustment unit 44 described later. The read synchronous comparing operation unit 43 stores the calculated data accumulation amount DS in the data accumulation amount register of the register 16. The calculation unit 12 refers to the data accumulation amount DS of the register 16 and performs a process of changing the number of data read from the storage unit 31.

The counter adjustment unit 44 adjusts the difference between the read address and the write address to be less than the size of the predetermined address range at the timing of starting the generation of the bus clock. More specifically, the counter adjustment unit 44 instructs the read address counter pointer 37 to adjust the value of the read pointer RPTR so that the difference between the write pointer WPTR and the read pointer RPTR immediately after the bus clock supplying signal CB_EN changes to the enabled state becomes a predetermined value set in advance. Here, as an exemplary predetermined value, a value smaller than the largest value is considered as the data-accumulation-amount DS of the storage unit 31. When the largest value of the data-accumulation-amount DS is N, N−1 can be set to a predetermined value.

Figure 2:
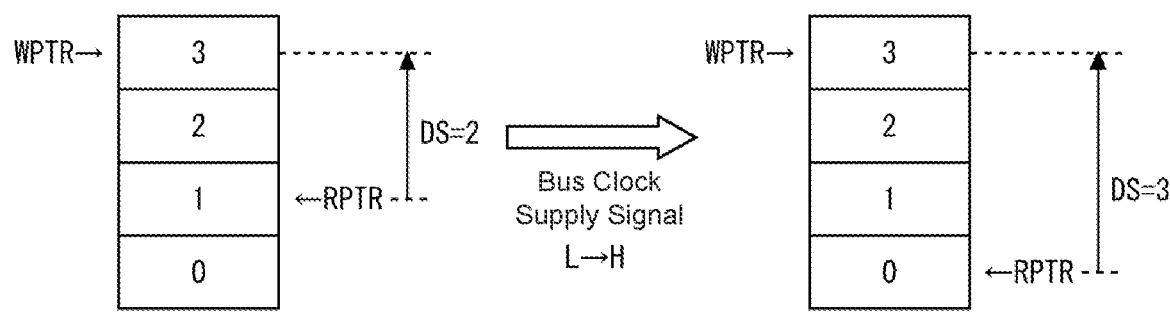
FIG. 2 is a diagram for explaining processing of the address adjustment unit of the ring buffer according to the first embodiment.
Figure 2:
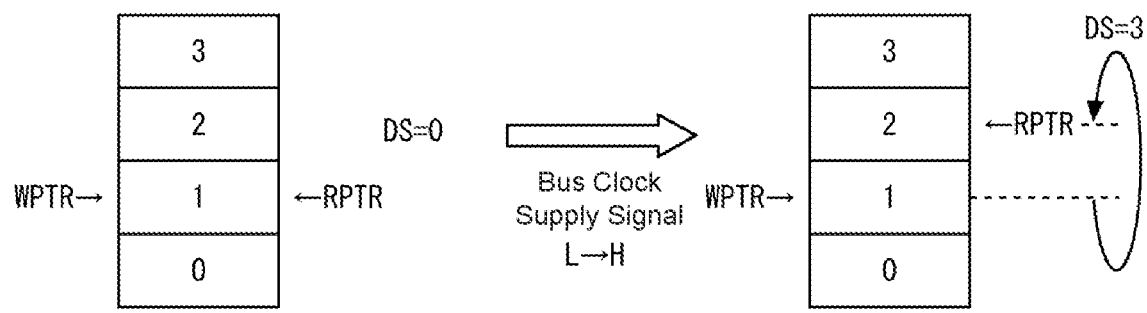

Here, the operation of the counter adjustment unit 44 will be described using specific values. FIG. 2 is a diagram for explaining the processing of the address adjustment unit of the ring buffer according to the first embodiment. FIG. 2 shows two cases where the peak value N of the data-accumulation amount DS is 4.

In the first example illustrated in the upper diagram of FIG. 2, the write-pointer WPTR immediately before the bus clock supplying signal CB_EN is changed from the disabled state (for example, the low level) to the enabled state (for example, the high level) is set to 3. In this first embodiment, when the bus clock supply signal CB_EN is switched to the enable state, the counter adjusting unit 44 instructs the read address counter pointer 37 to set the read pointer RPTR to 0 so that the value of the read pointer RPTR is N−1 (=3) from the write pointer WPTR.

Further, in the second example shown in the lower drawing of FIG. 2, the write-pointer WPTR immediately before the bus clock supplying signal CB_EN is changed from the disabled state (for example, the low level) to the enabled state (for example, the high level) is set to 1. In the second embodiment, when the bus clock supply signal CB_EN is switched to the enable state, the counter adjusting unit 44 instructs the read address counter pointer 37 to set the read pointer RPTR to 2 so that the value of the read pointer RPTR is N−1 (=3) from the write pointer WPTR.

That is, the counter adjustment unit 44 instructs the read address counter pointer 37 to adjust the pointer value so that the value of the read pointer RPTR derived based on Equation (1) is obtained when the largest value of the data accumulation amount DS is set to N and the predetermined value is set to N−1.

$$PRTR=((N+WPRT)-(N-1)) \bmod N \quad (1)$$

In the semiconductor device 1 according to the first embodiment, the data writing to the storage unit 31 is continued based on the core clock even when the bus clock is stopped, and the counter adjustment unit 44 adjusts the data reading start position after the supply of the bus clock is resumed, thereby reading the data accumulated in the storage unit 31 before the supply of the bus clock is resumed. Therefore, the operation of the semiconductor device 1 according to the first embodiment will be described below.

Figure 3:
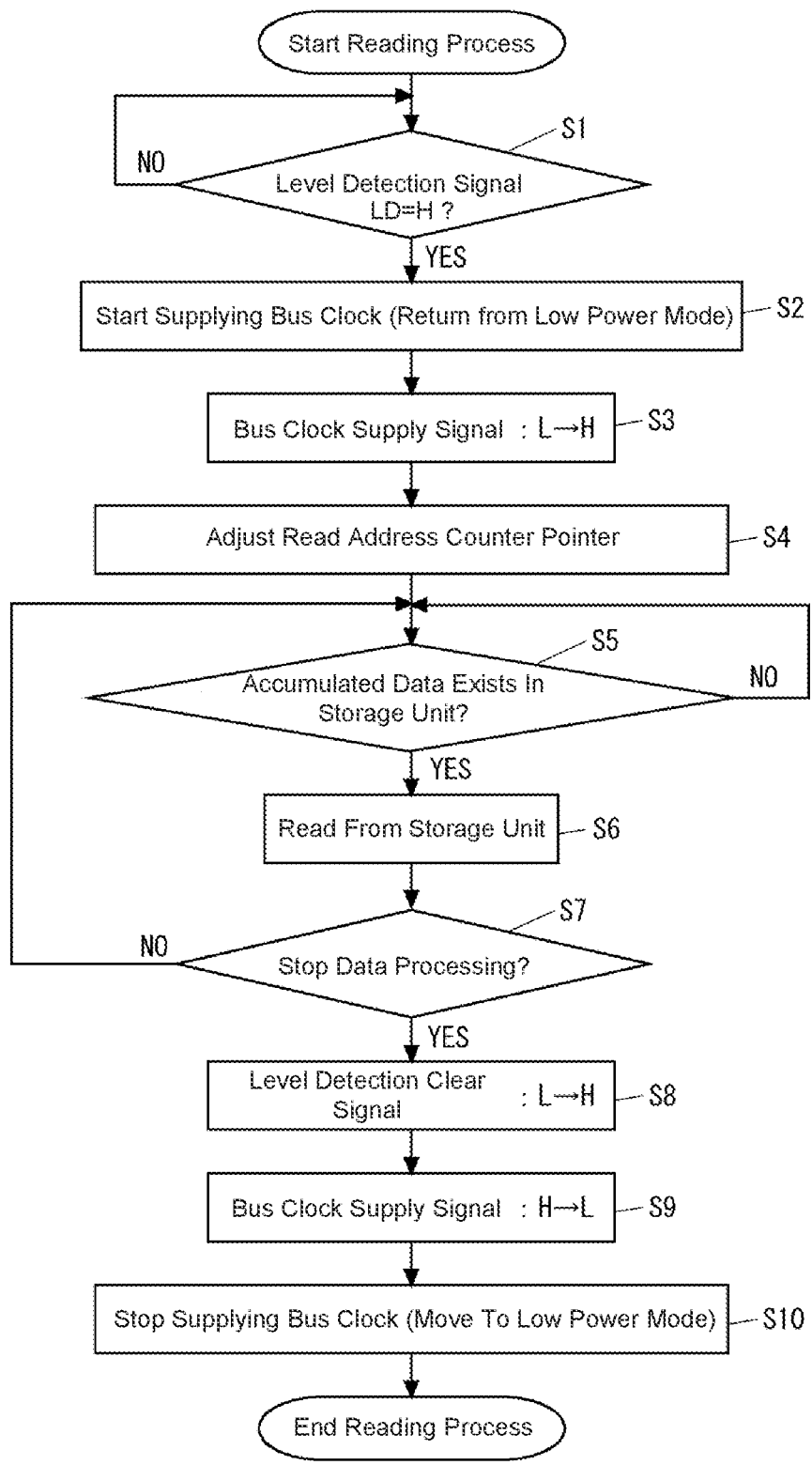
FIG. 3 is a flowchart for explaining an operation of a semiconductor device according to a first embodiment.

FIG. 3 is a flowchart for explaining the operation of the semiconductor device according to the first embodiment. In the semiconductor device 1 according to the first embodiment, the operation according to the flowchart shown in FIG. 3 is repeated every time the bus clock is stopped. Further, in the flowchart shown in FIG. 3, invalid data is supplied to the semiconductor device 1 as stream data, and the operation is started from a period in which the supply of the bus clock is stopped.

In the semiconductor device 1 according to the first embodiment, the level detecting unit 17 sets the level detecting signal LD to the low level during the period in which invalid data is received as the stream data. Thus, in the semiconductor device 1 according to the first embodiment, the system controller 11 maintains a state in which the bus clock generation unit 15 is stopped during a period in which invalid data is input as stream data.

As shown in FIG. 3, in the semiconductor device 1 according to the first embodiment, when the level detecting unit 17 recognizes that valid data is inputted as stream data, the level detecting unit 17 switches the level detecting signal LD from the low level to the high level (step S1). Then, in response to the switching of the level detecting signal LD to the high level, the system controller 11 instructs the bus clock generating unit 15 to generate a bus clock, and the bus clock generating unit 15 starts supplying the bus clock (step S2). As a result, the semiconductor device 1 transitions from the low power consumption state to the normal state.

Further, the system controller 11 rewrites the value of the bus clock supply signal register of the register 16 from the low level to the high level. As a result, in the semiconductor device 1, the bus clock supply signal CB_EN is switched from the disable state (for example, the low level) to the enable state (for example, the high level) (step S3). Then, in response to the bus clock supplying signal CB_EN being enabled, the counter adjusting unit 44 adjusts the reading pointer RPTR with respect to the reading address counter pointer 37 (step S4). In this S4 of steps, the read-pointer RPTR is adjusted based on Equation (1).

Thereafter, the semiconductor device 1 refers to the data accumulation amount DS, and if there is data accumulated in the storage unit 31, the data is read from the storage unit 31 using the arithmetic unit 12 and DMAC13 (step S5, S6). Further, the reading of the data in the step S5, S6 is continued until the determination of stopping the process in the data process performed in CUP 12 is performed (NO branch of the step S7). That is, in the semiconductor device 1 according to the first embodiment, after valid data is input as stream data, the supply of the bus clock is continued for a period until it is determined that the processing may be stopped in the data processing, and the reading of the data from the storage unit 31 is continuously performed.

Then, in the semiconductor device 1 according to the first embodiment, when CPU 12 determines that invalid data has been inputted as stream data (branch of S7 of steps), YES of the register 16 is operated by CPU 12 so that the level-detection-clear-signal LDC is raised (step S8). By rewriting the register value S8 this step, the level detection clear signal LDC becomes a high level, and the detection control unit 21 of the level detection unit 17 sets the value of the level detection signal LD to a low level. Further, in response to the low level of the level detecting signal LD, the system controller 11 switches the bus clock supply signal CB_EN from the high level to the low level by rewriting the bus clock supply signal register (step S9). Thereafter, the system controller 11 instructs the bus clock generation unit 15 to stop supplying the bus clock (step S10). Thus, the semiconductor device 1 shifts to the low power consumption state in which the supply of the bus clock is stopped.

Figure 4:
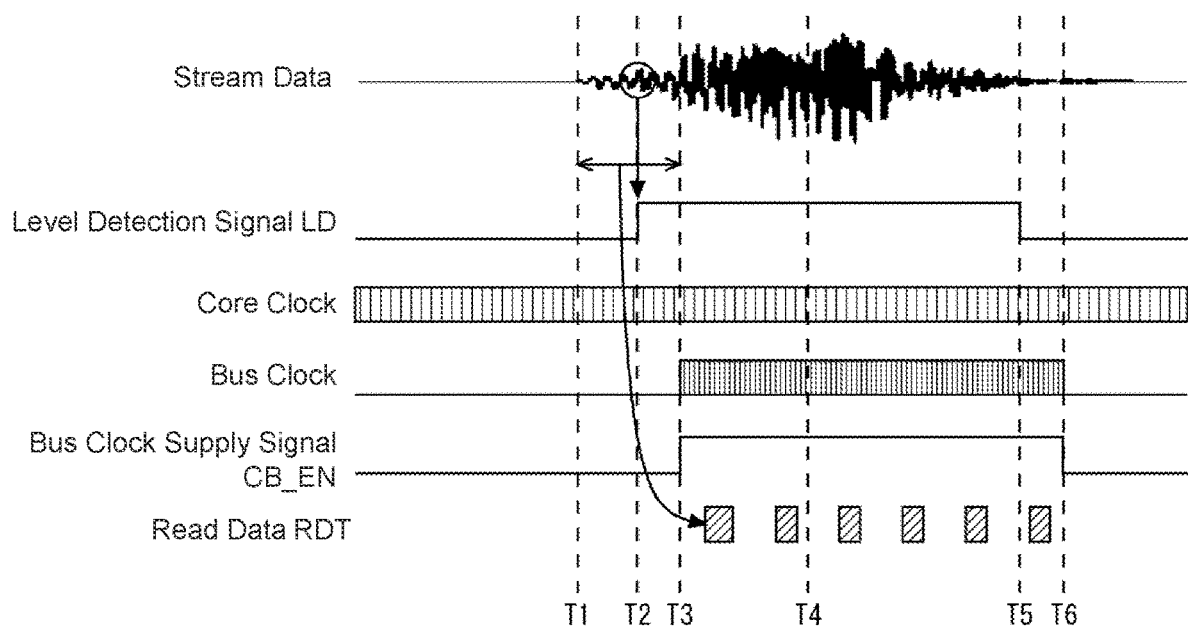
FIG. 4 is a timing chart illustrating an operation of a semiconductor device according to a first embodiment.

Next, the operation of the semiconductor device 1 according to the first embodiment will be described using a specific signal. FIG. 4 is a timing chart for explaining the operation of the semiconductor device according to the first embodiment. FIG. 4 illustrates an example in which an audio signal or the like whose amplitude changes in an analog manner is input as stream data.

In the embodiment illustrated in FIG. 4, although the audio signal changes from silence to presence at the timing T1, the audio signal is not regarded as valid at the time of starting the input because there is insufficient amplitude (e.g., noise level), and the level detecting unit 17 maintains the level detecting signal LD at the low level. Thereafter, the amplitude of the stream data gradually increases, and the level detection unit 17 changes the level detection signal LD from the low level to the high level in response to determining that the amplitude exceeds the threshold setting value Th at the timing T2. Then, the system controller 11 rewrites the value of the bus clock supply signal register of the register 16 from 0 to 1 in response to the rising edge of the level detection signal LD of the timing T2, so that the bus clock supply signal CB_EN becomes a high level at the timing T3.

Here, in consideration of the clock signal, the core clock is continuously supplied to the semiconductor device 1 while the stream data is input, regardless of whether the stream data is a voiced sound or a silent sound. On the other hand, the bus clock is generated in response to the level detecting signal LD being at a high level, and the generation is stopped in response to the data process in CPU 12 in which it is determined that a new data acquisition is not necessary.

In the semiconductor device 1, the storage of the stream data in the storage unit 31 is continued based on the core clock even in a period before the bus clock is generated (for example, before the timing T3). When the supply of the bus clock is started at the timing T3, the read data RDT is started to be read from the storage unit 31 based on the bus clock. In the example illustrated in FIG. 4, the data is read intermittently. In the reading of data, the number of data continuously read out varies according to the data accumulation DS of the storage unit 31 every reading cycle.

Then, the level detecting unit 17 switches the level detecting signal LD from the high level to the low level based on the determination that CPU 12 may stop the data process at the timing T5. Then, in response to the low level of the level detecting signal LD, the system controller 11 rewrites the value of the bus clock supply signal register from 1 to 0, whereby the bus clock supply signal CB_EN is switched from the high level to the low level. Further, the supply of the bus clock is stopped at the timing T6.

Figure 5:
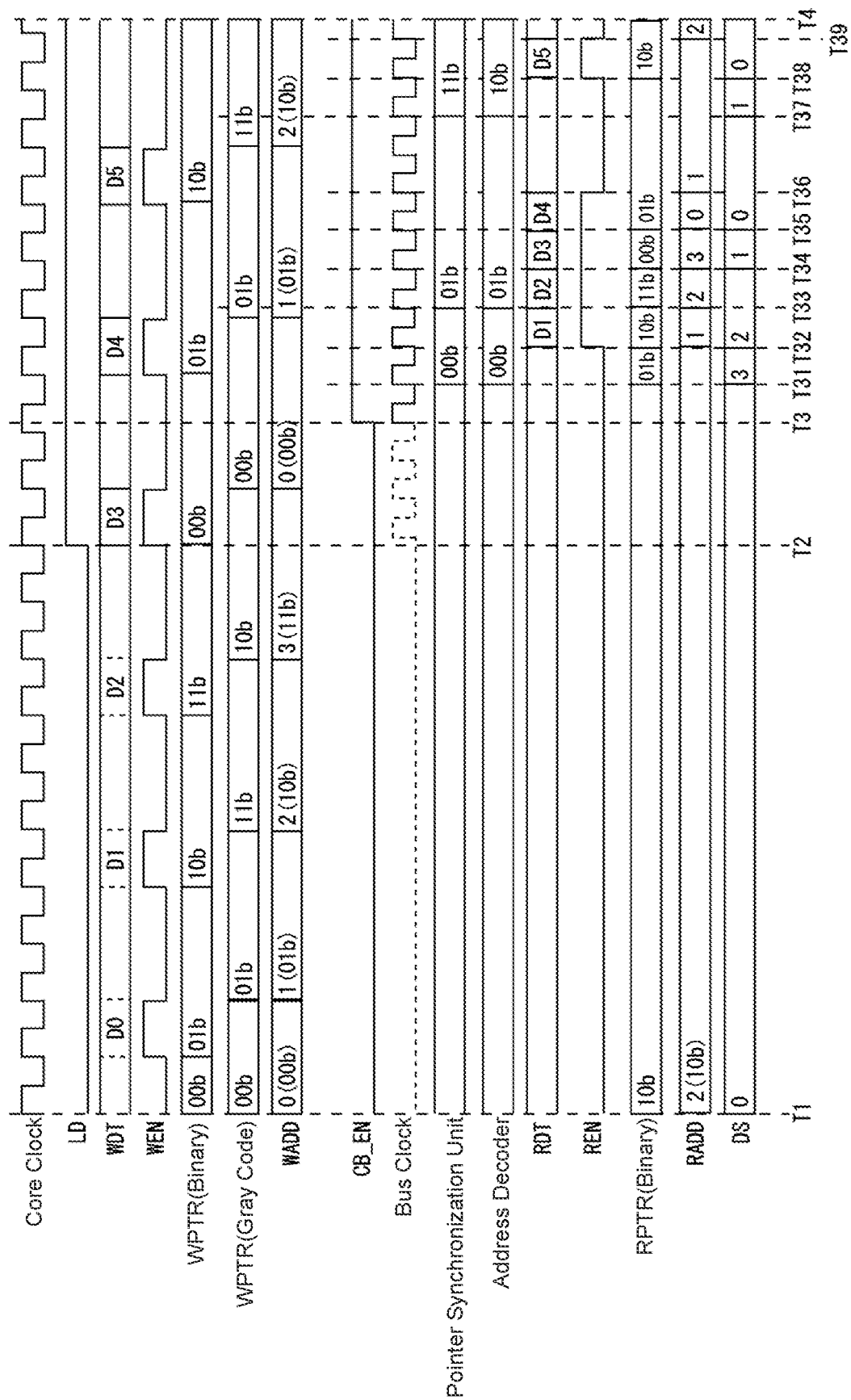
FIG. 5 is a detailed timing chart illustrating an operation of a semiconductor device according to a first embodiment.

Here, the flow of the signal in the semiconductor device 1 during the timing T4 from the timing T1 will be described in more detail. Note that the timing T4 is a timing after the timing T3 and at which the reading of the data from the storage unit 31 is completed twice. FIG. 5 is a detailed timing chart illustrating the operation of the semiconductor device 1 according to the first embodiment. Note that the example illustrated in FIG. 5 is an example in which the largest value N of the data-accumulation amount DS is 4.

As shown in FIG. 5, in the semiconductor device 1, the core clock is continuously supplied while the stream data is input as described with reference to FIG. 4. In the exemplary embodiment illustrated in FIG. 5, in the timing T1, the write pointer WPTR is 00, and the write address WADD corresponding to the write pointer WPTR is 0. WPTR of write pointers conversion to gray codes is 01. Further, the read pointer RPTR in the timing T1 is 10 at a time point when the bus clock is stopped at a timing (not shown), and the read address RADD corresponding to the read pointer RPTR is 2.

After the timing T1, the data receiving unit 10 outputs the write enable WEN to a high level in synchronization with the data D0~D5. Further, each time the data receiving unit 10 transmits data to the ring buffer 18, the write address counter pointer 34 cyclically advances the write pointer WPTR to 01, 10, 11, 00, . . . , in synchronization with the rising edge of the write enable WEN. The timing at which the write address counter pointer 34 advances the write pointer WPTR is the timing at which the rising edge of the write enable WEN is inputted. In addition, a change in the write-pointer WPTR is reflected in the write-address WADD in synchronization with a rising edge following the rising edge of the core clock inputted in synchronization with the rising edge of the write enable WEN. Thus, in the ring buffer 18, the data D0~D3 serving as the write data WDT is stored in an area where the write address WADD is 0 to 3, and the data D4, D5 is stored in an area where the write address WADD is 0 to 1.

In the semiconductor device 1 according to the first embodiment, the write address encoder 40 generates a gray code corresponding to the write pointer WPTR generated by the write address counter pointer 34 at a timing synchronized with the write address converter 35. In the exemplary embodiment illustrated in FIG. 5, the gray codes are changed in the order of 00, 01, 11, 10, 00, . . . , with respect to WPTR of write pointers that are changed to 00, 01, 10, 11, 00, . . . .

In the exemplary embodiment illustrated in FIG. 5, the data D0, D1, D2 is invalid data that does not reach a sufficient value, and the data D3, D4, D5 is valid data. Therefore, the level detecting signal LD is switched to the high level at the timing T2 at which the data D3 is inputted. Thus, from the timing T2, the system controller 11 instructs the bus clock generation unit 15 to start generating the bus clock. However, since it takes time to stabilize the frequency of the bus clock, the system controller 11 switches the bus clock supplying signal CB_EN from the low level to the high level at the timing T3 after the timing T2. As a result, the bus clock is started to be supplied from the timing T3, and the reading of the data from the storage unit 31 is started.

At the timing T31 at which the rising edge of the first bus clock after the timing T3 is inputted, the write address synchronization unit 41 replaces the write pointer WPTR indicated by the gray code from the core clock to the bus clock. In addition, the write address decoder 42 converts the write pointer WPTR outputted by the write address synchronization unit 41 into a write pointer WPTR indicated by a binary code. In the semiconductor device 1, the write address synchronization unit 41 and the write address decoder 42 update the write pointer WPTR in synchronization with the rising edge of the bus clock immediately after the write pointer WPTR changes. In the embodiment illustrated in FIG. 5, the timing T33, T37 is the update timing of the write pointer WPTR in the write address synchronization unit 41 and the write address decoder 42.

Further, as shown in FIG. 5, in the semiconductor device 1 according to the first embodiment, in response to the bus clock supply signal CB_EN becoming the high level at the timing T3, the counter adjusting unit 44 instructs the value of the pointer to be output to the read address counter pointer 37 so that the difference from the write pointer WPTR output by the write address decoder 42 becomes a predetermined value set in advance. The predetermined value may be, for example, a value that is a N−1 when the largest value of the data-accumulation-amount DS is N. Specifically, when the maximum value N is 4, the predetermined value is 3. Thus, in the timing T31, the data-accumulation-amount DS is 3. Further, the read pointer RPTR outputted by the read address counter pointer 37 is 01, which differs from the write pointer WPTR by 3.

Then, the following process is performed on the timing T32 which is the rising timing of the bus clock after the timing T31. In the timing T32, the read address RADD becomes 01 indicating the address value 1 in accordance with the value of the read pointer RPTR. Then, in response to the data accumulation amount DS being 3 in the timing T31, the arithmetic unit 12 sets the read enable REN to the storage unit 31 to an enabled state (for example, a high level). In this way, the data D1 is read from the storage area where the address is 1. Further, since the read enable REN is enabled, the read address counter pointer 37 advances the read pointer RPTR by one to 10. Furthermore, in response to the data D1 being read, the data accumulation DS is updated from 3 to 2. Note that, in the embodiment illustrated in FIG. 5, the data D0 is discarded by being overwritten with a data D4 to be described later, but the data D0 is invalid data and may be invalidated.

Next, the following process is performed on the timing T33 which is the rising timing of the bus clock after the timing T32. In the timing T33, the read address RADD becomes 10 indicating the address value 2 in accordance with the value of the read pointer RPTR. Then, in response to the data accumulation amount DS at the timing T32 being 2, the arithmetic unit 12 sets the read enable REN to the storage unit 31 to an enabled state (for example, a high level). In this way, the data D2 is read out from the storage area where the address is 2. Further, since the read enable REN is enabled, the read address counter pointer 37 advances the read pointer RPTR by one to 11. Note that in the timing T33, since the write pointer WPTR outputted by the write address decoder 42 advances by one to 01 (the address value becomes 1), even if the data D2 is read, the data accumulation amount DS is maintained at 2.

Next, the following process is performed on the timing T34 which is the rising timing of the bus clock after the timing T33. In the timing T34, the read address RADD becomes 11 indicating the address value 3 in accordance with the value of the read pointer RPTR. Then, in response to the data accumulation amount DS at the timing T33 being 2, the arithmetic unit 12 sets the read enable REN to the storage unit 31 to an enabled state (for example, a high level). In this way, the data D3 is read from the storage area having the address value of 3. Further, since the read enable REN is enabled, the read address counter pointer 37 advances the read pointer RPTR by one to 00. Furthermore, in response to the data D3 being read, the data accumulation DS is updated from 2 to 1.

Next, the following process is performed on the timing T35 which is the rising timing of the bus clock after the timing T34. In the timing T35, the read address RADD becomes 00 indicating the address value 0 in accordance with the value of the read pointer RPTR. Then, in response to the data accumulation amount DS at the timing T34 being 1, the arithmetic unit 12 sets the read enable REN to the storage unit 31 to an enabled state (for example, a high level). In this way, the data D4 is read from the storage area where the address is 0. Further, since the read enable REN is enabled, the read address counter pointer 37 advances the read pointer RPTR by one to 01. Further, in response to the data D4 being read, the data accumulation DS is updated from 1 to 0.

Next, the following process is performed on the timing T36 which is the rising timing of the bus clock after the timing T35. In the timing T36, the read address RADD becomes 01 indicating the address value 1 in accordance with the value of the read pointer RPTR. Then, since the data accumulation amount DS in the timing T35 is 0, the arithmetic unit 12 sets the read enable REN to the disable state (for example, the low level). As a result, the data is not read from the storage unit 31. Further, since the read enable REN is disabled, the read address counter pointer 37 maintains the read pointer RPTR at 01. Furthermore, since data accumulation in the storage unit 31 is not performed at this point, the data accumulation quantity DS is maintained at 0.

Next, after the timing T35, the following process is performed on the timing T37 which is the rising timing of the bus clock immediately after the write pointer WPTR outputted by the write address decoder 42 is updated in response to the updating of the write pointer WPTR. In the timing T37, the read pointers RPTR and the read address RADD are maintained at the time of the timing T36. On the other hand, the data-accumulation-amount DS is 1 when the write-pointer WPTR advances by one.

Next, the following process is performed on the timing T38 which is the rising timing of the bus clock after the timing T37. In the timing T38, in response to the data accumulation amount DS at the timing T37 being 1, the arithmetic unit 12 sets the read enable REN to the storage unit 31 to an enabled state (for example, a high level). In this way, the data D5 is read from the storage area where the address is 1. Further, since the read enable REN is enabled, the read address counter pointer 37 advances the read pointer RPTR by one to 10. Further, in response to the data D5 being read, the data accumulation DS is updated from 1 to 0.

Next, the following process is performed on the timing T39 which is the rising timing of the bus clock after the timing T38. In the timing T39, the read address RADD becomes 10 indicating the address value 2 in accordance with the value of the read pointer RPTR. Then, since the data accumulation amount DS in the timing T38 is 0, the arithmetic unit 12 sets the read enable REN to the disable state (for example, the low level). As a result, the data is not read from the storage unit 31. Further, since the read enable REN is disabled, the read address counter pointer 37 maintains the read pointer RPTR at 01. Furthermore, since data accumulation in the storage unit 31 is not performed at this point, the data accumulation quantity DS is maintained at 0.

From the above description, in the semiconductor device 1 according to the first embodiment, the power consumed by the internal circuit can be reduced by stopping the bus clock during a period in which invalid data that does not need to be processed is input as stream data. At this time, the semiconductor device 1 according to the first embodiment continues to accumulate data in the storage unit 31 by the core clock even during the bus clock stop period. Then, the semiconductor device 1 according to the first embodiment performs a read process after restarting the supply of the bus clock after setting the read pointer RPTR so that the difference from the write pointer WPTR at that point in time becomes a predetermined value set in advance. Thus, the semiconductor device 1 according to the first embodiment can prevent data loss caused by the bus clock stop without processing such as operation delay. That is, the semiconductor device 1 according to the first embodiment can obtain a high power consumption reduction effect while preventing a decrease in the processing speed.

Further, in the semiconductor device 1 according to the first embodiment, the write address encoder 40, the write address synchronization unit 41, and the write address decoder 42 are used to transmit the write pointer WPTR to the read address counter pointer 37 by the gray code. Thus, in the semiconductor device 1 according to the first embodiment, it is possible to reduce the error occurrence rate of the data caused by the metastable generated when transmitting from the circuit system operating with the core clock to the circuit system operating with the bus clock.

Further, in the semiconductor device 1 according to the first embodiment, the ring buffer 18 outputs a data accumulation amount DS indicating the data amount accumulated in the storage unit 31. As a result, the arithmetic unit 12 serving as the data processing unit can switch the content of the reading process and other data processes. Further, since the data accumulation amount DS immediately after the bus clock supply resumption is known, there is no need to perform a process of confirming the data accumulation amount again in the reading process immediately after the arithmetic unit 12 bus clock supply resumption.

Embodiment 2

Figure 6:
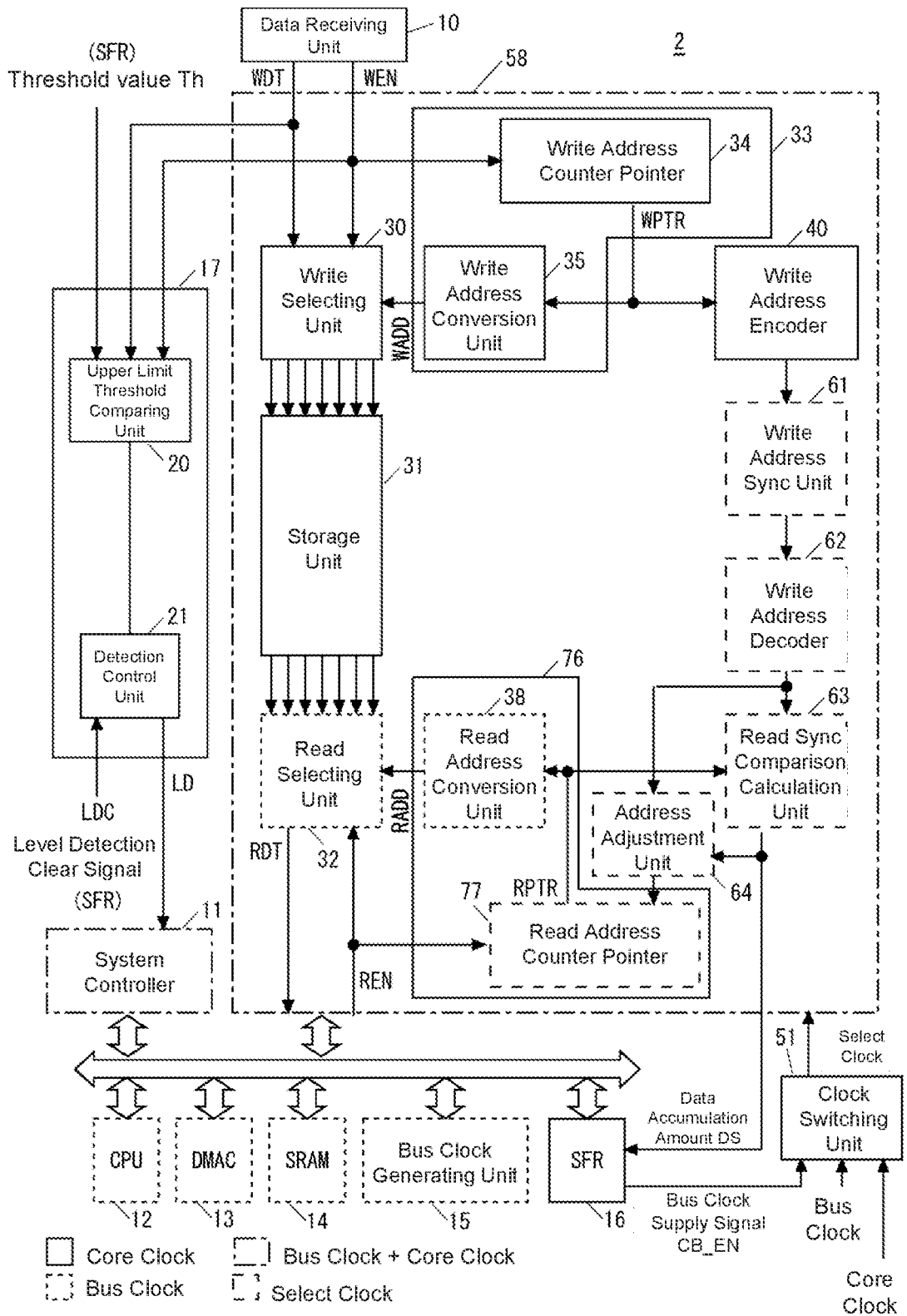
FIG. 6 is a block diagram of a semiconductor device according to a second embodiment.

In Embodiment 2, a semiconductor device 2 that is another embodiment of the semiconductor device 1 according to Embodiment 1 will be described. In the description of the second embodiment, the same components as those described in the first embodiment are denoted by the same reference numerals as those in the first embodiment, and description thereof is omitted. FIG. 6 is a block diagram of a semiconductor device according to a second embodiment.

As shown in FIG. 6, in the semiconductor device 2 according to the second embodiment, the ring buffer 18 is replaced with the ring buffer 58, and the clock switching unit 51 is added. The clock switching unit 51 switches the clock supplied to the ring buffer 18 between the bus clock and the core clock based on whether or not the bus clock is supplied. More specifically, the clock switching unit 51 supplies the core clock to at least the read synchronous comparative operation unit 63, the address adjustment unit (for example, the counter adjustment unit 64), and the read address generation unit (for example, the read address counter pointer 77) during the period in which the bus clock generation unit 15 is stopped, and supplies the bus clock to the read synchronous comparison operation unit 63, the counter adjustment unit 64, and the read address counter pointer 77 during the period in which the bus clock generation unit 15 is operating. The clock signal output from the clock switching unit 51 is referred to as a select clock in the following description. Then, the clock switching unit 51 recognizes the supply state of the bus clock by the bus clock supply signal CB_EN, and switches between the core clock and the bus clock as the select clock. Further, in the example shown in FIG. 6, since it corresponds to the case where the core clock and the bus clock are asynchronous, the select clock is also supplied to the write address synchronization unit 61 and the write address decoder 62.

The ring buffer 58 includes a write address synchronization unit 41, a write address decoder 42, a read synchronization comparison calculator unit 43, a counter adjustment unit 44, and a read address generation unit 36 of the ring buffer 18 according to the first embodiment, instead of the write address synchronization unit 61, a write address decoder 62, a read synchronization comparison operation unit 63, a counter adjustment unit 64, and a read address generation unit 76. The read address generation unit 76 replaces the read address counter pointer 37 of the read address generation unit 36 with the read address counter pointer 77.

The write address synchronization unit 61, the write address decoder 62, the read synchronization comparison operation unit 63, and the read address counter pointer 77 are circuit blocks that operate with a select clock. The write address synchronization unit 61, the write address decoder 62, the read synchronization comparison calculator unit 63, and the read address counter pointer 77 operate in the same manner as the write address synchronization unit 41, the write address decoder 42, the read synchronization comparison operation unit 43, and the read address counter pointer 37.

The counter adjustment unit 64 monitors the data accumulation amount DS and instructs the read address counter pointer 77 to adjust RPTR of read pointers to be generated so that the data accumulation amount DS falls within a predetermined value or less set in advance. The counter adjustment unit 64 has the same function as the counter adjustment unit 44 in that the value of the read pointer RPTR is adjusted so that the difference between the write pointer WPTR and the read pointer RPTR becomes equal to or smaller than a predetermined value, although the calculation method is different from the counter adjustment unit 44. The counter adjustment unit 64 operates based on the select clock.

Figure 7:
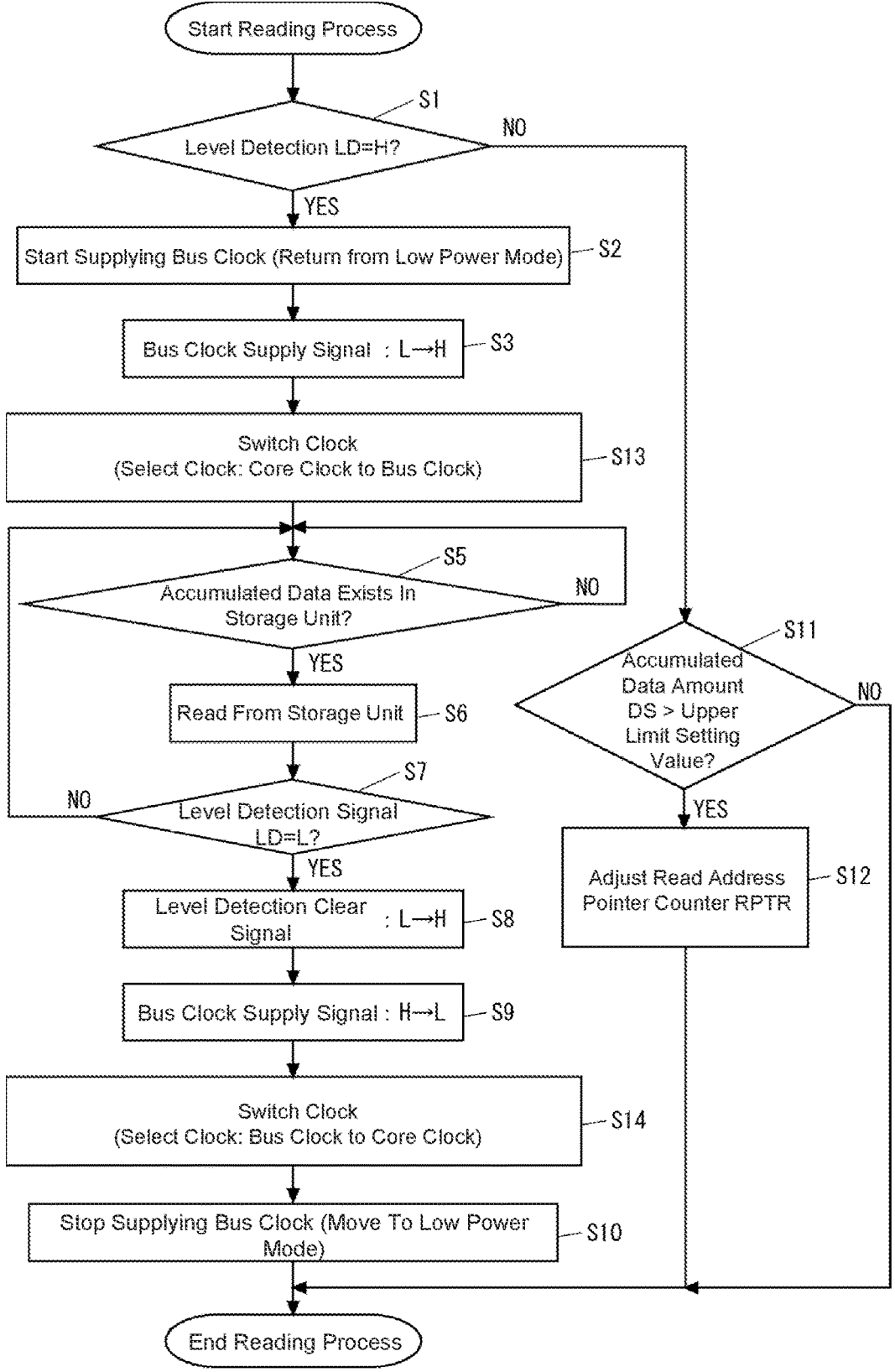
FIG. 7 is a flowchart for explaining an operation of a semiconductor device according to a second embodiment.

Next, the operation of the semiconductor device 2 according to the second embodiment will be described. FIG. 7 is a flowchart for explaining the operation of the semiconductor device according to the second embodiment. As shown in FIG. 7, the operation of the semiconductor device 2 according to the second embodiment is obtained by adding step S11, S12, S14 to the operation of the first embodiment, and further changing the step S4 to step S13.

In the semiconductor device 2 according to the second embodiment, since the read address counter pointer 77 and the read synchronous compare operation unit 43 operate even during the time period in which the bus clock is stopped, the data accumulation DS of the storage unit 31 is updated every time writing to the storage unit 31 proceeds. Therefore, as shown in FIG. 7, in the semiconductor device 2 according to the second embodiment, when the level detecting signal LD is at the low level in the step S1 (NO branch of the step), the counter adjusting unit 64 compares the data accumulation amount DS with the upper limit setting value (for example, a predetermined value) (step S11). In this step S11, when the data accumulation amount DS is larger than the predetermined value (branch of YES of the step S11), the counter adjusting unit 64 adjusts the read pointer RPTR so that the data accumulation amount DS becomes equal to or smaller than the predetermined value (step S12). On the other hand, in the step S11, if the data-accumulation-amount DS is equal to or less than the predetermined value (branch of NO of the step S11), the process is terminated without adjusting the read-pointer RPTR by the counter-adjusting unit 64.

Further, in the semiconductor device 2 according to the second embodiment, instead of adjusting the read-pointer RPTR (step S4) shown in FIG. 3, a process of switching a clock outputted as a select clock from a core clock to a bus clock is performed (step S13).

In the semiconductor device 2 according to the second embodiment, after the bus clock supply signal CB_EN is set to the low level and before the supply of the bus clock is stopped (between the step S9 and the step S10), a process of switching a clock output as a select clock from the bus clock to the core clock is performed (step S14).

Figure 8:
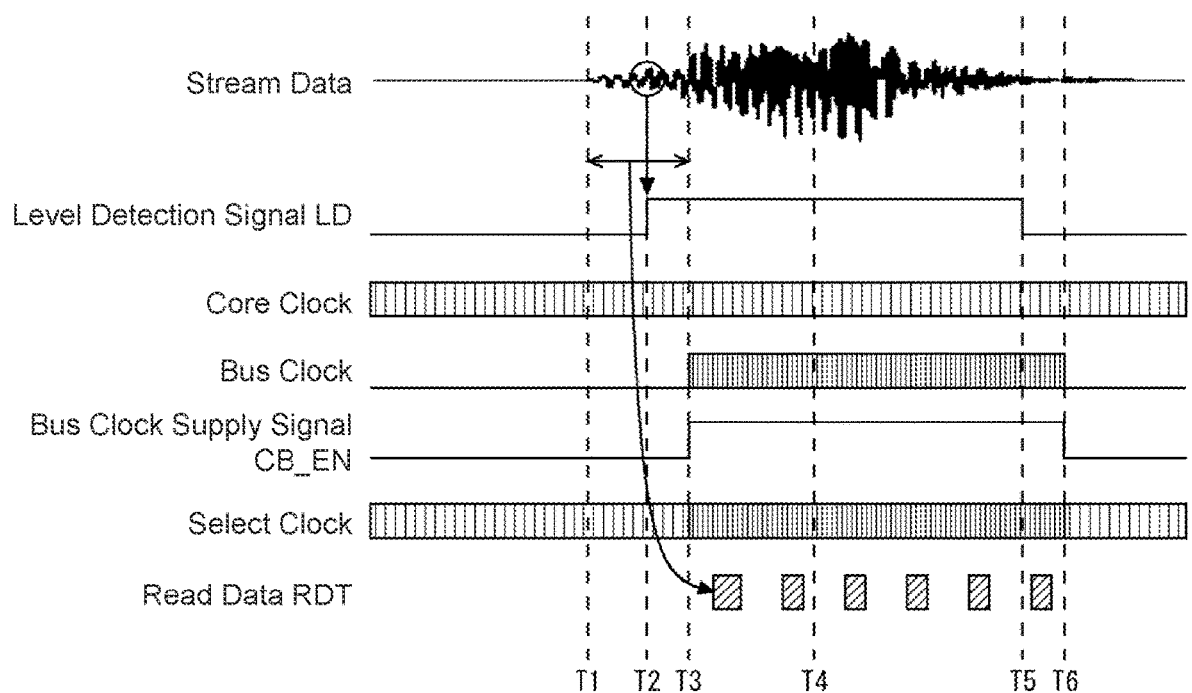
FIG. 8 is a timing chart illustrating an operation of a semiconductor device according to a second embodiment.

The operation of the semiconductor device 2 according to the second embodiment according to the above-described flowchart will be described with reference to a timing chart. FIG. 8 is a timing chart for explaining the operation of the semiconductor device according to the second embodiment. As shown in FIG. 8, the data writing and reading operations of the semiconductor device 2 according to the second embodiment are the same as those of the semiconductor device 1 according to the first embodiment, but the presence or absence of a select clock is different. The select clock is the bus clock only during the period in which the bus clock is supplied, and is the core clock during the other period. The difference in the operation between the semiconductor device 2 according to the first embodiment and the semiconductor device 1 according to the first embodiment is that the level detecting signal LD is at a low level and the bus clock is not supplied. Therefore, the operation of the semiconductor device 2 during the timing T2~T4 of FIG. 8 will be described below.

Figure 9:
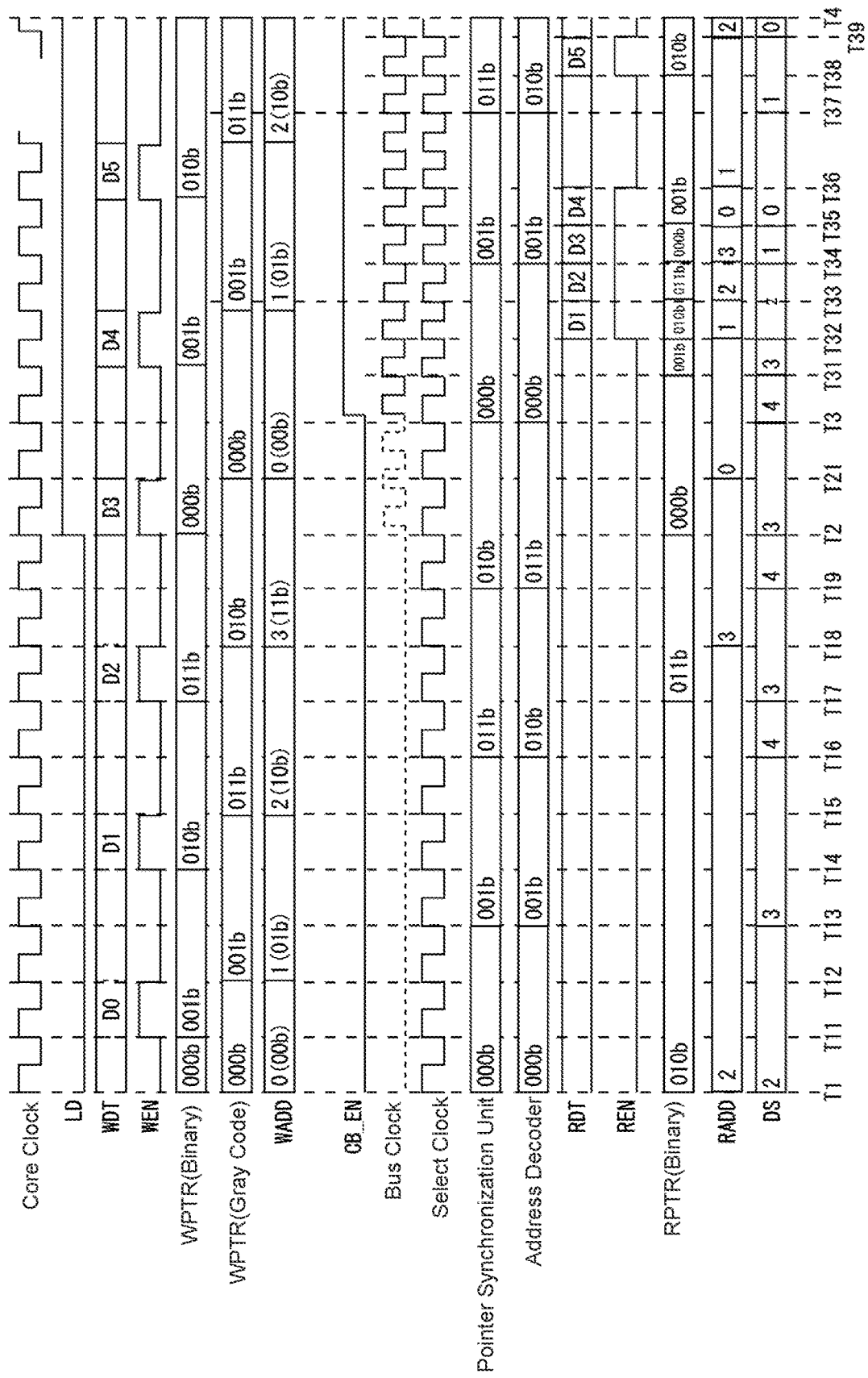
FIG. 9 is a detailed timing chart for explaining the operation of the semiconductor device according to the second embodiment.

FIG. 9 is a detailed timing chart illustrating the operation of the semiconductor device 2 according to the second embodiment. The example shown in FIG. 9 shows a case where the semiconductor device 2 according to the second embodiment performs an operation in the same period as that of the semiconductor device 1 according to the first embodiment shown in FIG. 5. In the semiconductor device 2 according to the second embodiment, when the largest value N of the data accumulation amount DS is 4, the value of the data accumulation amount changes from 0 to 4. Therefore, in the embodiment illustrated in FIG. 9, in order to avoid overflow in calculating the data accumulation amount DS, the write pointer WPTR (both the binary code and the gray code), the output value of the write address synchronization unit 61, the output value of the write address decoder 62, and the read pointer RPTR (the binary code) are indicated by 3-bit values, respectively. Note that, for example, by using a configuration such as an overflow flag, a value indicated by 3 bits in FIG. 9 can be processed by 2 bits.

As shown in FIG. 9, in the semiconductor device 2 according to the second embodiment, the operation after the start of the supply of the bus clock and after the start of the reading of the data is the same as that of the semiconductor device 1 according to the first embodiment. Hereinafter, the operation of the semiconductor device 1 according to the first embodiment and the semiconductor device 2 according to the second embodiment will be described in detail up to the timing T1~T31 in which the operation differs.

In the exemplary embodiment illustrated in FIG. 9, in the timing T1, the write pointer WPTR is 000, and the write address WADD corresponding to the write pointer WPTR indicates 0. WPTR of write pointers conversion to gray codes is 000. In addition, the write pointers WPTR outputted by the write address synchronization unit 41 and the write address decoder 42 in the timing T1 both indicate 000. The read-pointer RPTR indicates 010 and the read-address RADD indicates 2. As a result, the data-accumulation-amount DS in the timing T1 is 2.

Then, the following process is performed in the timing T11 which is the timing of the rising edge of the core clock after the timing T1. In the timing T1*l*, the data receiving unit 10 outputs the data D0 with the write enable WEN as the enable state. In response to the write enable WEN being enabled, the write address counter pointer 34 advances the write pointer WPTR by one to 001. At this time, since the write address WADD is not updated and 000 indicating the address value 0 is maintained, the data D0 is stored in the storage area where the address value is 0. Further, in the timing T1*l*, since the write address encoder 40 does not reflect the updating of the write pointer WPTR, the values output by the write address synchronization unit 61 and the write address decoder 62 maintain the values at the timing T1. In addition, since the bus clock is stopped, the read enable REN is also maintained in the disabled state, and the read pointer RPTR, the read address RADD, and the data accumulation DS outputted by the read address counter pointer 77 are maintained in the timing T1.

Next, in the timing T12 which is the rising timing of the core clock after the timing T1*l*, the following process is performed. In the timing T12, the data reception unit 10 sets the write enable WEN to the disable state and enters the data non-transfer state. In response to the rising edge of the core clock, the write address converter 35 updates the write address WADD to 001 corresponding to the write-pointer WPTR. Further, the write address encoder 40 updates the gray code corresponding to the write pointer WPTR to 001. Here, in the timing T12, the value of the write pointer WPTR of the gray code updated by the write address encoder 40 is not reflected in the value outputted by the write address synchronization unit 61 and the write address decoder 62. In addition, since the bus clock is stopped, the read enable REN is also maintained in the disabled state, and the read pointer RPTR, the read address RADD, and the data accumulation DS outputted by the read address counter pointer 77 are maintained in the timing T1.

Next, in the timing T13 which is the rising timing of the core clock after the timing T12, the following process is performed. In the timing T13, the write pointer WPTR and the write address WADD are maintained at timing T12 so that the data receiver 10 maintains the write enable WEN in a disabled state. On the other hand, in the timing T13, the output value is set to 001 reflecting the value of the write pointer WPTR represented by the gray code updated by the write address encoder 40. Then, upon receiving the update of the output of the write address synchronization unit 61, the write pointer WPTR output by the write address decoder 62 is updated to 001. At this time, since the bus clock is stopped, the read enable REN is also maintained in the disable state, so that the read pointer RPTR and the read address RADD outputted from the read address counter pointer 77 are maintained in the timing T1. Then, in the timing T13, the write pointer WPTR outputted by the write address decoder 62 is updated, so that the data accumulation DS is updated from 2 to 3.

Next, the following process is performed in the timing T14 which is the timing of the rising edge of the core clock after the timing T13. In the timing T14, the data receiving unit 10 outputs the data D1 with the write enable WEN as the enable state. In response to the write enable WEN being enabled, the write address counter pointer 34 advances the write pointer WPTR by one to 010. At this time, since the write address WADD is not updated and 001 indicating the address value 1 is maintained, the data D1 is stored in the storage area where the address value is 1. Further, in the timing T14, since the write address encoder 40 does not reflect the updating of the write pointer WPTR, the values output by the write address synchronization unit 61 and the write address decoder 62 maintain the values at the timing T13. In addition, since the bus clock is stopped, the read enable REN is also maintained in the disabled state, and the read pointer RPTR, the read address RADD, and the data accumulation DS outputted by the read address counter pointer 77 are maintained in the timing T13.

Next, in the timing T15 which is the rising timing of the core clock after the timing T14, the following process is performed. In the timing T15, the data reception unit 10 sets the write enable WEN to the disable state and enters the data non-transfer state. In response to the rising edge of the core clock, the write address converter 35 updates the write address WADD to 010 corresponding to the write-pointer WPTR. Further, the write address encoder 40 updates the gray code corresponding to the write pointer WPTR to 011. Here, in the timing T15, the value of the write pointer WPTR of the gray code updated by the write address encoder 40 is not reflected in the value outputted by the write address synchronization unit 61 and the write address decoder 62. In addition, since the bus clock is stopped, the read enable REN is also maintained in the disabled state, and the read pointer RPTR, the read address RADD, and the data accumulation DS outputted by the read address counter pointer 77 are maintained in the timing T13.

Next, in the timing T16 which is the rising timing of the core clock after the timing T15, the following process is performed. In the timing T16, the write pointer WPTR and the write address WADD are maintained at timing T15 so that the data receiver 10 maintains the write enable WEN in a disabled state. On the other hand, in the timing T16, the output value is set to 011 reflecting the value of the write pointer WPTR represented by the gray code updated by the write address encoder 40. Then, upon receiving the update of the output of the write address synchronization unit 61, the write pointer WPTR output by the write address decoder 62 is updated to 010. At this time, since the bus clock is stopped, the read enable REN is also maintained in the disable state, so that the read pointer RPTR and the read address RADD outputted from the read address counter pointer 77 are maintained in the timing T13. Then, in the timing T16, the write pointer WPTR outputted by the write address decoder 62 is updated, so that the data accumulation DS is updated from 3 to 4.

Next, the following process is performed in the timing T17 which is the timing of the rising edge of the core clock after the timing T16. In the timing T17, the data receiving unit 10 outputs the data D2 with the write enable WEN as the enable state. In response to the write enable WEN being enabled, the write address counter pointer 34 advances the write pointer WPTR by one to 011. At this time, since the write address WADD is not updated and 010 indicating the address value 2 is maintained, the data D2 is stored in the storage area where the address value is 2. Further, in the timing T17, since the write address encoder 40 does not reflect the updating of the write pointer WPTR, the values output by the write address synchronization unit 61 and the write address decoder 62 maintain the values at the timing T16. In addition, since the bus clock is stopped, the read enable REN is also maintained in the disable state, and the read address RADD is maintained in the timing T16. On the other hand, in the timing T16, since the data accumulation amount DS becomes 4 and becomes larger than the predetermined value, the counter adjusting unit 64 instructs the read address counter pointer 77 to advance the read pointer RPTR one by one. Thus, in the timing T17, the data-accumulation-amount DS is updated to 3.

Next, in the timing T18 which is the rising timing of the core clock after the timing T17, the following process is performed. In the timing T18, the data reception unit 10 sets the write enable WEN to the disable state and enters the data non-transfer state. In response to the rising edge of the core clock, the write address converter 35 updates the write address WADD to 011 corresponding to the write-pointer WPTR. Further, the write address encoder 40 updates the gray code corresponding to the write pointer WPTR to 010. Here, in the timing T18, the value of the write pointer WPTR of the gray code updated by the write address encoder 40 is not reflected in the value outputted by the write address synchronization unit 61 and the write address decoder 62. Further, since the bus clock is stopped, the read enable REN is also maintained in the disabled state, and the read pointer RPTR and the data accumulation DS outputted by the read address counter pointer 77 are maintained in the timing T17. On the other hand, in the timing T18, the read-address RADD is updated from 2 to 3 when RPTR of read-pointers becomes 011 in the timing T17.

Next, in the timing T19 which is the rising timing of the core clock after the timing T18, the following process is performed. In the timing T19, the write pointer WPTR and the write address WADD are maintained at timing T18 so that the data receiver 10 maintains the write enable WEN in a disabled state. On the other hand, in the timing T19, the output value is set to 010 reflecting the value of the write pointer WPTR represented by the gray code updated by the write address encoder 40. Then, upon receiving the update of the output of the write address synchronization unit 61, the write pointer WPTR output by the write address decoder 62 is updated to 011. At this time, since the bus clock is stopped, the read enable REN is also maintained in the disable state, so that the read pointer RPTR and the read address RADD outputted from the read address counter pointer 77 are maintained in the timing T17. Then, in the timing T19, the write pointer WPTR outputted by the write address decoder 62 is updated, so that the data accumulation DS is updated from 3 to 4.

Next, the following process is performed in the timing T2 which is the timing of the rising edge of the core clock after the timing T18. In the timing T2, the data receiving unit 10 outputs the data D3 with the write enable WEN as the enable state. In response to the write enable WEN being enabled, the write address counter pointer 34 advances the write pointer WPTR by one to 000. At this time, since the write address WADD is not updated and 011 indicating the address value 3 is maintained, the data D3 is stored in the storage area where the address value is 3. Further, in the timing T2, since the write address encoder 40 does not reflect the updating of the write pointer WPTR, the values output by the write address synchronization unit 61 and the write address decoder 62 maintain the values at the timing T16. In addition, since the bus clock is stopped, the read enable REN is also maintained in the disable state, and the read address RADD is maintained in the timing T19. On the other hand, in the timing T19, since the data accumulation amount DS becomes 4 and becomes larger than the predetermined value, the counter adjusting unit 64 instructs the read address counter pointer 77 to advance the read pointer RPTR one by one. Thus, in the timing T2, the data-accumulation-amount DS is updated to 3. Since the data D3 is valid data, the level detecting unit 17 switches the level detecting signal LD from the low level to the high level.

Then, the system controller 11 instructs the bus clock generation unit 15 to start generating the bus clock, and the bus clock generation unit 15 starts generating the bus clock. Next, in the timing T21 which is the rising timing of the core clock after the timing T2, the following process is performed. In the timing T21, since the bus clock is not yet enabled, the select clock is the core clock. Then, in the timing T21, the data receiving unit 10 sets the write enable WEN to the disable state and enters the data non-transfer state. In response to the rising edge of the core clock, the write address converter 35 updates the write address WADD to 000 corresponding to the write-pointer WPTR. Further, the write address encoder 40 updates the gray code corresponding to the write pointer WPTR to 000. Here, in the timing T21, the value of the write pointer WPTR of the gray code updated by the write address encoder 40 is not reflected in the value outputted by the write address synchronization unit 61 and the write address decoder 62. In addition, since the bus clock is stopped, the read enable REN is also maintained in the disabled state, and the read pointer RPTR and the data accumulation DS outputted by the read address counter pointer 37 are maintained in the timing T2. On the other hand, in the timing T21, the read-address RADD is updated from 3 to 0 when RPTR of read-pointers becomes 000 in the timing T2.

Next, in the timing T3 which is the rising timing of the core clock after the timing T21, the following process is performed. In the timing T3, since the bus clock is not yet enabled, the select clock is the core clock. In the embodiment illustrated in FIG. 5, since the bus clock supplying signal CB_EN is enabled between the timing T3 and the timing T31, the operation using the bus clock is performed after the timing T31. In the timing T3, the write pointer WPTR and the write address WADD are maintained at timing T21 so that the data receiver 10 maintains the write enable WEN in a disabled state. On the other hand, in the timing T3, the output value is set to 000 reflecting the value of the write pointer WPTR represented by the gray code updated by the write address encoder 40. Then, upon receiving the update of the output of the write address synchronization unit 61, the write pointer WPTR output by the write address decoder 62 is updated to 000. At this time, since the bus clock is not yet enabled, the read enable REN is also maintained in the disabled state, and the read pointer RPTR and the read address RADD outputted from the read address counter pointer 77 are maintained in the timing T2. Then, in the timing T3, the write pointer WPTR outputted by the write address decoder 62 is updated, so that the data accumulation DS is updated from 3 to 4.

Next, the following process is performed in the timing T31 which is the timing of the rising edge of the bus clock after the timing T3. In the timing T31, since the bus clock supplying signal CB_EN is enabled, the write address synchronization unit 61, the write address decoder 62, the read synchronizing and comparing operation unit 63, the counter adjusting unit 64, the read address counter pointer 77, the read address converting unit 38, and the read selecting unit 32 start the operation based on the bus clock. The system controller 11, the arithmetic unit 12, DMAC13, and the memory 14 are also started to operate based on the bus clock.

In the timing T31, since there is no change in the write pointer WPTR output from the write address encoder 40, the values output from the write address decoder 62 and the read synchronous compare operation unit 63 are maintained at the timing T3. On the other hand, in the timing T31, the counter adjusting unit 64 instructs the read address counter pointer 77 to advance the read pointer RPTR one by one in response to the data accumulation DS becoming 4 at the timing T3 and exceeding a predetermined value. As a result, in the timing T31, RPTR of read pointers becomes 001, and the data-accumulation-amount DS is updated from 4 to 3. Since the operations after the timing T32 are the same as those of the semiconductor device 1 according to the first embodiment, the description thereof will be omitted.

As described above, in the semiconductor device 2 according to the second embodiment, by using the select clock, the read pointer RPTR is adjusted so that the difference between the read pointer RPTR and the write pointer WPTR does not exceed a predetermined value even when the bus clock is stopped. Thus, in the semiconductor device 2 according to the second embodiment, for example, it is possible to reduce the probability of occurrence of an operation failure caused by an error in data transfer in the write address synchronization unit 61.

Embodiment 3

In the third embodiment, the level detection unit 17a, 17b that is another form of the level detecting unit 17 will be described. In the description of the third embodiment, the same components as those described in the first embodiment are denoted by the same reference numerals as those in the first embodiment, and description thereof will be omitted.

Figure 10:
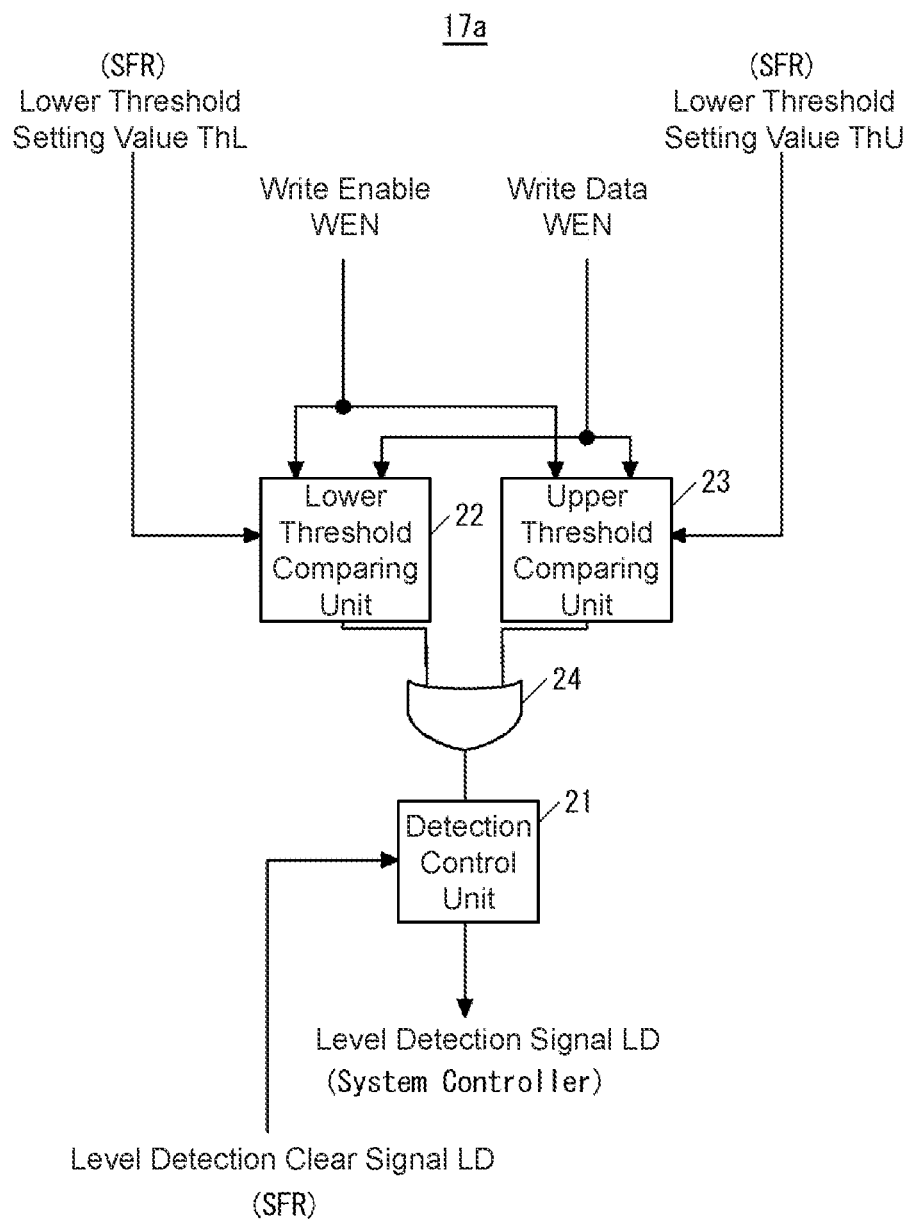
FIG. 10 is a block diagram of a first example of a level detection unit according to a third embodiment.

First, FIG. 10 is a block diagram of a first example of the level detection unit according to the third embodiment. In FIG. 10, 17a reference numerals are assigned to the level-detecting unit. The level-detecting unit 17a corresponds to a case where the write data WDT is signed data. Further, it is assumed that the lower limit threshold setting value ThL and the upper limit threshold setting value ThH inputted to the level detector 17a are given from the register 16.

The level detection unit 17a replaces the upper limit threshold comparing unit 20 of the level detecting unit 17 according to the first embodiment with the lower limit threshold comparing unit 22, the upper limit threshold comparing unit 23, and OR circuitry 24. The write enable WEN and the write data WDT are both inputted to the lower limit threshold comparing unit 22 and the upper limit threshold comparing unit 23. Then, the lower limit threshold comparing unit 22 determines the magnitude relation between the value of the write data WDT and the lower limit threshold setting value ThL while the write enable WEN is enabled (for example, at a high level). More specifically, the lower limit threshold comparing unit 22 outputs a high level signal when the value of the write data WDT is smaller than the lower limit threshold setting value ThL. The upper limit threshold comparing unit 23 determines the magnitude relation between the value of the write data WDT and the upper limit threshold setting value ThH while the write enable WEN is enabled (for example, at a high level). More specifically, the upper-limit threshold comparing unit 23 outputs a high-level signal when the value of the write-data WDT is larger than the upper-limit threshold setting value ThH. OR circuitry 24 sets the output signal to a high level while at least one of the lower limit threshold comparing unit 22 and the upper limit threshold comparing unit 23 outputs a high level.

According to the level detection unit 17a, even when the write data WDT is signed data, it is possible to perform level detection of a positive value and a negative value on data having a certain magnitude or more.

Figure 11:
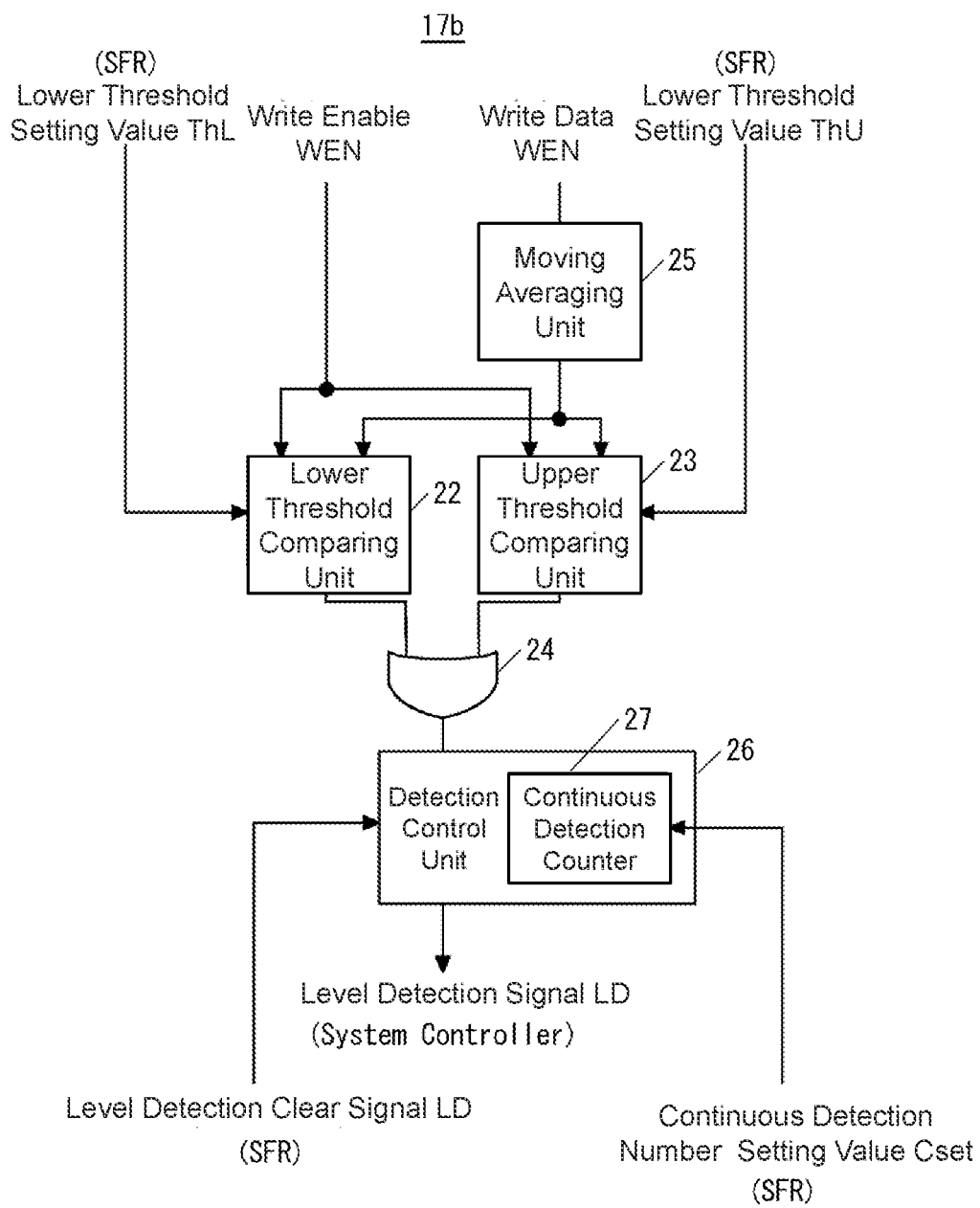
FIG. 11 is a block diagram of a second example of a level detection unit according to a third embodiment.

FIG. 11 is a block diagram illustrating a second example of the level detection unit according to the third embodiment. In FIG. 11, 17b reference numerals are assigned to the level-detecting unit. The level detection unit 17b adds the moving averaging unit 25 to the level detection unit 17a, and replaces the detection control unit 21 with the detection control unit 26. The detection control unit 26 adds the continuous detection counter 27 to the detection control unit 21.

The moving average processor 25 outputs an average of the write data WDT during a certain period. This prevents the level detecting signal LD from suddenly becoming a high level for a large or suddenly small write data WDT. In addition, the consecutive detection counter 27 counts a time interval during which OR circuit 24 is at a high level. Then, the continuous detection counter 27 restricts the detection control unit 26 from setting the level detection signal LD to the high level until the count value reaches the count number based on the continuous detection number setting value Cset given from the register 16.

According to the level-detecting unit 17*b*, it is possible to perform a high-noise detection process by suppressing the sensitivity of the write-data WDT to the sudden fluctuation of the signal. The moving average processing unit 25 and the detection control unit 26 may be applied to the level detection unit 17 having only the upper limit threshold comparison unit 20.

Although the invention made by the inventor has been specifically described based on the embodiment, the present invention is not limited to the embodiment already described, and it is needless to say that various modifications can be made without departing from the gist thereof.

What is claimed is:

1. A semiconductor device comprising:
    a data receiving circuit configured to convert external stream data to internal data processable in the semiconductor device;
    a level detection circuit configured to validate a level detection signal when a value indicated in the internal data successes a threshold value;
    a ring buffer circuit configured to sequentially and cyclically store the internal data in a storage area set within a predetermined address range;
    a bus clock generation circuit configured to generate a bus clock;
    a data processing circuit configured to perform a data processing based on the internal data obtained from the ring buffer circuit, the data processing being performed by the bus clock; and
    a system controller circuit configured to selectively operates the bus clock generator during a period in which the level detection signal indicates a valid state,
    wherein the ring buffer circuit comprises:
        a write address generating circuit configured to operate with a core clock used to capture the external stream data and generate a cyclically changing write address;
        a storage circuit configured to operate with the core clock and accumulates the internal data in the area specified by the write address;
        a read address generator circuit configured to operate with the bus clock and generates a cyclically changing read address; and
        an address adjusting circuit that adjusts the difference between the read address and the write address to be less than the size of the predetermined address range at the timing of starting generation of the bus clock.

2. The semiconductor device according to claim 1,
    wherein the address generating circuit comprises:
        a write pointer generating circuit configured to generate a write pointer which cycles through a range of values; and
        a write address conversion circuit configured to convert the write pointer into the write address which is the real address of the storage circuit,
    and wherein the read address generating circuit comprises:
        a read pointer generation circuit configured to generate a read pointer which cycles through a range of values; and
        a read address conversion circuit configured to convert the read pointer into the read address which is a real address of the storage circuit.

3. The semiconductor device according to claim 2, wherein the address adjustment circuit configured to control the read pointer generation circuit to output a pointer value obtained by subtracting a predetermined value less than the size of the predetermined address range from the write pointer as the read pointer.

4. The semiconductor device according to claim 2, further comprises a read synchronous comparison circuit that calculates a difference between the write pointer and the read pointer as a data accumulation amount of the internal data in the storage circuit.

5. The semiconductor device according to claim 4, further comprises a data accumulation amount register configured to store the data accumulation amount,
    wherein the data processing circuit is configured to change the number of data read from the storage circuit based on the value of the data accumulation amount register.

6. The semiconductor device according to claim 2, wherein the core clock is asynchronous to the bus clock.

7. The semiconductor device according to claim 6, further comprising:
    wherein the address generating circuit comprises:
        a write address encoder configured to convert values of adjacent the write pointers to gray code with changes limited to 1 bit;
        a write address synchronization circuit configured to replace the value of the write pointer indicated by the gray code from the core clock to the bus clock; and
        a write address decoder configured to convert the write pointer output from the write address synchronization circuit from the gray code to binary code.

8. The semiconductor device according to claim 6, further comprising:
    a clock switching circuit configure to:
    while the bus clock generation circuit is stopped, supply the core clock to the address adjustment circuit and the write pointer generation circuit;
    while the bus clock generation circuit is operating, supply the core clock to the address adjustment circuit and the write pointer generation circuit;
    a read synchronization comparison calculation circuit configure to obtain the difference between the write pointer and the read pointer as a data accumulation amount that is the internal data accumulated in the storage circuit,
    wherein the address adjustment circuit adjusts, in response to the data accumulation amount exceeds the predetermined value which is less than the predetermined address range, the value of the read pointer to the difference the difference between the write pointer and the read pointer becomes less than the predetermined value.

9. The semiconductor device according to claim 1, further comprises a bus clock supplying state notification register which indicates a logic state of the bus clock supply signal notifying the bus clock generation circuit operates,
    wherein the system controller is configured to set the value of the bus clock supply state notification register based on the level detection signal.

10. The semiconductor device according to claim 9, wherein the address adjustment circuit adjusts the read pointer while the bus clock supply signal indicates that the bus clock is being supplied.

* * * * *